United States Patent [19]

Sato et al.

[11] Patent Number: 4,883,704

[45] Date of Patent: Nov. 28, 1989

[54] CIRCUIT SUBSTRATE COMPRISING NITRIDE TYPE CERAMICS, METHOD FOR PREPARING IT, AND METALLIZING COMPOSITION FOR USE IN IT

[75] Inventors: Hideki Sato; Nobuyuki Mizunoya, both of Yokohama; Hironori Asai, Kawasaki; Kazuo Anzai, Tokyo; Tsuyoshi Hatano, Yokohama, all of Japan

[73] Assignee: Kabushiki Kaisha Toshiba, Kawasaki, Japan

[21] Appl. No.: 174,902

[22] Filed: Mar. 29, 1988

[30] Foreign Application Priority Data

| Mar. 30, 1987 | [JP] | Japan | 62-73989 |
| Mar. 31, 1987 | [JP] | Japan | 62-76164 |
| Mar. 31, 1987 | [JP] | Japan | 62-76165 |
| Feb. 26, 1988 | [JP] | Japan | 63-43858 |

[51] Int. Cl.$^4$ .................................. B32B 9/00
[52] U.S. Cl. ........................ 428/209; 428/210; 428/698; 428/901; 428/704; 428/472; 428/472.2; 428/699; 428/701; 174/68.5
[58] Field of Search ............... 174/68.5; 428/209, 210, 428/698, 901, 472, 472.2, 699, 701, 704

[56] References Cited

U.S. PATENT DOCUMENTS

| 4,659,611 | 4/1987 | Iware et al. .................. 428/698 |
| 4,740,403 | 4/1988 | Oomen et al. .................. 428/35 |
| 4,770,953 | 9/1988 | Horiguchi et al. .................. 428/698 |

Primary Examiner—Ellis P. Robinson
Assistant Examiner—P. J. Ryan
Attorney, Agent, or Firm—Foley & Lardner, Schwartz, Jeffery, Schwaab, Mack, Blumenthal & Evans

[57] ABSTRACT

One aspect of the present invention is directed to an aluminum nitride ceramic substrate which comprises an aluminum nitride ceramic sheet and a conductive metallized layer formed thereon. The metallized layer comprises molybdenum and/or tungsten and contains a compound containing yttria and alumina in the vicinity of the interface between the aluminum nitride ceramic sintered sheet and the conductive metallized layer.

3 Claims, 4 Drawing Sheets

CIRCUIT SUBSTRATE COMPRISING NITRIDE TYPE CERAMICS, METHOD FOR PREPARING IT, AND METALLIZING COMPOSITION FOR USE IN IT

BACKGROUND OF THE INVENTION

This invention relates to a circuit substrate comprising nitride type ceramics, and it is concerned with an AlN substrate comprising a metallized conductive layer formed on its surface with a high joint strength.

Ceramic substrates are widely used in circuit substrates, and recently used in circuit substrates for use in hybrid integrated circuits are substrates comprising a sintered body of nitride type ceramics, as exemplified by a sintered body of aluminum nitride (AlN), having a high thermal conductivity, an excellent heat dissipation property and an electric insulating property. The nitride type ceramics are prepared generally in the following manner: A given amount of a sintering aid such as $Y_2O_3$, $Sm_2NO_3$ and CaO is blended in nitride type ceramic powder with optionally further addition of an acrylic resin binder to thoroughly mix the whole, and the resulting mixture is, for example, pressure-molded to make a sintering precursor (a formed product) having a given shape, followed by sintering at a given temperature in, for example, a nitrogen atmosphere.

Incidentally, in instances in which nitride type ceramic sintered sheets are used as substrates for semiconductors, it is necessary to form a conductive layer on the face on which a semiconductor is mounted. Hitherto, this layer comprises a metallized conductive layer of copper (Cu), gold (Au) or silver-palladium (Ag-Pd) formed on the surface of a nitride type ceramic sintered sheet by applying a DBC process (direct bond copper process) or a thick film process.

However, this conventional substrate has the following problems.

A first problem is that the joint strength between the above metallized layer thus formed and the surface of the nitride type ceramic sintered sheet is so low that a peeling phenomenon may often occur.

A second problem is the problem that may be caused when a certain semiconductor device or wire is brazed on the metallized layer thus formed thereon. More specifically, in the instance of the brazing for example, it is carried out at a temperature of about 800° C. or so in a hydrogen-nitrogen mixed gas. Since, however, the temperature used at the time of the baking treatment for the above metallized layer is usually a lower temperature of about 600° to 1,000° C., the joint strength between the metallized layer and the surface of the nitride type ceramic sintered sheet is extremely lowered at the time of this brazing to make it virtually impossible to carry out the brazing. A third problem is the problem based on the difference in thermal expansion coefficient between the nitride type ceramic sintered sheet and the metallized layer. More specifically, like the instances of the brazing and the high-temperature soldering, the substrate mounted with a semiconductor device such as a silicon wafer experiences a severe heat cycle of heating/cooling when used. As a result, thermal stresses based on the difference in thermal expansion coefficient between layers are produced at the respective joint areas between the nitride type ceramic sintered body/metallized layer/brazed layer (or soldered layer)/semiconductor device, causing the action of peeling them.

In the case of the above metallized layer, the thermal expansion coefficient is greater as much as about 2 to 4 times than that value of the nitride type ceramic sintered sheet (thermal expansion coefficient: about $4.6 \times 10^{-6}/°$ C.) and is of a value of about a half of the value equivalent to the brazed layer (or soldered layer), showing a great difference from that of the nitride type ceramics. Accordingly, at the time of the heat cycle, fine cracks are liable to be produced at the interface between the metallized layer or brazed layer and the nitride type ceramics. Such fine cracks may gradually grow with repetition of heat cycles, finally sometimes bringing about the peel of the mounted semiconductor device.

Such problems are inconvenient as there may be lowered the reliability of an apparatus actually provided with the substrate mounted with a semiconductor device.

A fourth problem is that the joint strength between the above metallized layer and the nitride type ceramic sintered sheet is so small as to make low the reliability, like the second problem, when used at high temperatures.

For the reasons as above, it is recently practiced, in order to form the conductive layer, to form the metallized layer by coating on the surface of a ceramic substrate a paste chiefly comprised of molybdenum (Mo) or tungsten (W) and also titanium (Ti), zirconium (Zr) or hafnium (Hf) added thereto as an activation metal, followed by firing. In the resulting metallized layer, molybdenum and tungsten are thermoresistant metals that may not be oxidized by heat at the time of the firing, and titanium, zirconium and hafnium may act as the activation metal and adhere the thermoresistant metal on the surface of the ceramic substrate through the reaction with the ceramic.

Accordingly, also in the circuit substrates employing the nitride type ceramic substrate, there has been taken a method in which a paste for the metallized layer, chiefly comprised of the above molybdenum or tungsten and also an oxide or nitride of titanium, zirconium or hafnium added thereto as an activation metal is coated, followed by firing and reduction to form a conductive layer, or a method in which this paste is coated on the ceramic substrate, followed by firing to adhere the metallized layer thereon by the action of the activation metal, or the like method.

In the instance in which the metallized conductive layer comprises the above W layer, Mo layer or TiN layer, the above problems becomes less serious than the instance in which it comprises the Cu layer, Au layer or Ag-Pd layer previously mentioned, and it can be achieved to improve the joint strength to the nitride type ceramic sintered body and the reliability in a practical use.

However, the problems as follows have arisen in the circuit substrate on which the metallized layer is formed like this by coating, on the surface of the ceramic substrate comprised of the nitride type ceramic sintered body, a paste chiefly comprised of molybdenum or tungsten and also titanium, zirconium or hafnium added thereto as an activation metal, followed by firing to form the metallized layer.

That is to say, there may arise scattering in the joint strength of the metallized layer to the nitride type ceramic substrate, resulting in non-uniformity in the joint strength of the metallized layer. Also, the surface of the metallized layer is applied with plating in order to mount a semiconductor device on the metallized layer. In this occasion, however, it is sometimes impossible to surely form a coating on the surface of the metallized layer, because grain boundary phases of the AlN substrate exude to the surface of the metallized layer. Thus, an anxiety is accompanied when a semiconductor device is firmly fitted on the metallized layer.

In addition, in the method employing the metallizing paste obtained by adding and mixing a nitride of the above activation metal in the high-melting metal such as Mo and W, no sufficient joint strength can be attained unless the firing temperature is raised to higher temperatures as much as 1,700° C. to 1,800° C., so that warpage of the substrate may occur. Also, no metallized layer can be formed unless the activation metal is added in a large amount as much as 70% by weight or more, and therefore, because the amount of the high-melting metal to be blended becomes small, the electric resistance becomes greater and moreover the difference in thermal expansion coefficient from that of the ceramic substrate becomes greater. Thus, there have been involved the problem that cracking is liable to occur by the application of cold and heat cycles. Another problem is also caused such that the scattering in the joint strength also occurs in regard to the AlN ceramic substrates of about 150 W/m·k having many grain boundary phases.

In the method in which the metallizing paste employing the compound such as Mo and W, there have also been involved the problem that bleeding occurs at the time of the coating or firing to make it difficult to retain the shape of circuit patterns, or no sufficient surface properties.

SUMMARY OF THE INVENTION

This invention was made on the basis of the above circumstances, and a first object thereof is to provide a circuit substrate such that a metallized layer employing molybdenum or tungsten can be firmly joined to the surface of an aluminum nitride substrate with a uniform joint strength and a coating can be firmly formed on the metallized layer, thus having a high reliability.

A second object of this invention is to provide a surface conductive ceramic substrate having a metallized layer that can achieve small electric resistance, large joint strength and good pattern form retension even by firing at relatively low temperatures, a method for preparing it, and a metallizing composition for use in it.

In regard to the nitride type ceramic substrates wherein the metallized layer comprises a W, Mo or W-Mo layer, the present inventors made studies on the relationship between the state of the interface between the nitride type ceramic sintered sheet and the W, Mo or W-Mo layer, and the joint strength. As a result, they found the fact that a layer of compounds containing yttria ($Y_2O_3$) and alumina ($Al_2O_3$) was formed at the interface part and in the vicinity thereof in regard to the substrates having a high joint strength, and such compounds were not present in a concentrated form at this interface part and in the vicinity thereof on the contrary in regard to the substrates having a low joint strength. This phenomenon was also seen in the instances of the substrates wherein the metallized layer comprises a Mo layer or TiN layer.

Based on these findings, the present inventors had an idea that the joint strength of the substrate could be improved if the compounds containing yttria and alumina are made present in a concentrated form to form a layer, at the interface between the nitride type ceramic substrate and the metallized layer and at the portion being from the interface to the metallized layer, and, having confirmed the correctness of that idea through an experimental route, developed the nitride type ceramic substrate of this invention.

Namely, the nitride type ceramic substrate that can achieve the first object of this invention is characterized in that a layer of a compound containing yttria and alumina is present in the vicinity of the interface between a nitride type ceramic sintered sheet and a conductive metallized layer formed on the surface of said nitride type ceramic sintered sheet.

In other words, the nitride type ceramic substrate of this invention comprises;

a nitride type ceramic sintered sheet;

a conductive metallized layer formed on said nitride type ceramic sintered sheet;

and a layer of a compound containing yttria and alumina, present in the vicinity of the interface between said nitride type ceramic sintered sheet and said metallized layer.

The present inventors further progressed their searches about the above nitride type ceramic substrate of this invention on the bases of the following different two aspects, i.e., i) an aspect that the above first object is achieved by making uniformly present the above compounds containing yttrium Y and aluminum Al, and ii) an aspect that the above second object is achieved by firmly joining the nitride type ceramic substrate and the metallized layer without making present the above compounds. As a result, they succeeded in leading the above aspects i) and ii) to the following embodiments i) and ii), respectively.

Embodiment i) will be first described below.

Specifically, in instances in which the metallized layer is formed in a sintering step by firing the metallizing paste coated on the surface of the nitride type ceramic substrate, $Al_2O_3$ on the nitride type ceramic reacts with the sintering aid $Y_2O_3$ to produce a compound, and this compound exists at a grain boundary of the nitride type ceramic sintered body as a grain boundary substance. Meanwhile, the metallizing paste comprised of molybdenum or tungsten and further the activation metal added thereto is usually fired at a temperature of from 1700° C. to 1750° C. Firing the metallizing paste at this firing temperature, the compounds of $Al_2O_3$ with $Y_2O_3$ present inside the nitride type ceramic substrate as the grain boundary substances turn to a liquid phase, and exude to enter into the metallized layer on the surface of the substrate, which compounds have the action to combine in the metallized layer with the activation metal, titanium, zirconium or hafnium, to cause adhesion between the metallized layer and the nitride type ceramic substrate. More specifically, when the nitride type ceramic substrate is prepared, yttria ($Y_2O_3$) is added as a sintering aid to nitride type ceramic powder in order to enhance the sinter density, and a body fromed by use of this powder is sintered. Liquid phase sintering takes place in this sintering step, $Al_2O_3$ on the nitride type ceramic reacts with the sintering aid $Y_2O_3$ to produce a compound, and it follows that this compound exists at a grain boundary of the nitride type ceramic sintered body as a grain boundary substance. The compound is presumed to exist in the form of YAG ($5Al_2O_3 \cdot 3Y_2O_3$), YAM ($Al_2O_3 \cdot Y_2O_3$), YAL ($Al_2O_3 \cdot 2Y_2O_3$) or $Y_2O_3$. Then, when the metallizing paste coated on the surface of the nitride type ceramic substrate, i.e., the nitride type ceramic sintered body is fired at a temperature of from about 1,500° to 1,700°C., the compounds of $Al_2O_3$ with $Y_2O_3$ present inside the nitride type ceramic substrate as the grain boundary substances are again fused to exude to the surface of the substrate and soak into the metallized layer.

As set out previously, the joint strength of the metallized layer to the nitride type ceramic substrate can be enhanced by utilizing this phenomenon.

However, the grain boundary substances present in the nitride type ceramic substrate, i.e., the compounds of $Al_2O_3$ with $Y_2O_3$, are distributed usually in a non-uniform state, and therefore the state in which the compounds of $Al_2O_3$ with $Y_2O_3$ exude from the nitride type ceramic substrate and soak into the metallized layer tends to become also non-uniform. Accordingly, scattering tends to occur in the joint strength as the joint strength is partly different between the metallized layer and nitride type ceramic substrate. Moreover, in regard to the step of preparing the nitride type ceramic sintered body, it is very difficult to make control so that the grain boundary substances, the compounds of $Al_2O_3$ with $Y_2O_3$, may be made uniformly present.

Now, the present inventors noted not to rely only on the grain boundary substances present in the inside of the nitride type ceramic substrate, but to supply the same compounds of $Al_2O_3$ with $Y_2O_3$ as the grain boundary substances from outside to form the metallized layer on the surface of the nitride type ceramic substrate. They have thus found that this method makes it possible to make control so that the compounds of $Al_2O_3$ with $Y_2O_3$ may be uniformly distributed over the metallized layer, whereby the metallized layer can be joined to the nitride type ceramic substrate with uniform joint strength. As a more specific method based on this viewpoint, they found a method in which the components for the compounds are added in the metallizing paste to form the metallized layer and a method in which a layer of the compounds is formed on the surface of the nitride type ceramic substrate and the metallized layer is formed thereon, thus accomplishing the embodiment (i).

Embodiment (ii) of this invention will be described below.

The present inventors also found that the grain boundary substances soaked into the inside of the metallized layer may also exude to the surface of the metallized layer, and, in some instances, this exuded grain boundary substances may make it impossible to plate the surface of the metallized layer in a good state.

The sintering to be carried out at high temperatures as previously described can not be said to be appropriate in an industrial viewpoint when taking account of the cost or the like. More specifically, following is the means that can achieve the second object of this invention without using high temperatures and without using the above compounds containing yttrium and aluminum.

In the surface conductive ceramic substrate according to the embodiment (ii), a first invention is characterized by comprising;

a nitride type ceramic substrate; and a conductive metallized layer chiefly comprised of at least one of Mo and W, a group IVa active metal element and a fourth period transition metal (except for Ti), formed on said substrate; and a second invention is characterized by comprising;

a nitride type ceramic substrate;

an intermediate reactive layer chiefly comprised of a compound containing a grain boundary constituent phase component of said ceramic substrate, and a compound of a group IVa active metal; and a conductive metallized layer chiefly comprised of at least one of Mo and W, a nitride of a group IVa active metal and a composite compound comprising an oxide of a group IVa active metal and an oxide of a fourth period transition metal (except for Ti), formed on said substrate with the interposition of said intermediate reactive layer.

In the method for preparing the surface conductive ceramic substrate of the embodiment (ii), a first invention is characterized by comprising;

coating on a nitride type ceramic substrate a paste containing (a) a metallizing composition chiefly comprised of at least one of Mo and W, an oxide of a group IVa active metal and at least one selected from compounds of fourth period transition metals (except for Ti), and (b) a binder;

followed by firing at 1,700° C. or less in an inert atmosphere to form a conductive metallized layer on said substrate; and a second invention is characterized by comprising;

coating on a nitride type ceramic substrate a liquid material containing (a) a metallizing composition chiefly comprised of at least one of Mo and W, an oxide of a group IVa active metal, at least one selected from compounds of fourth period transition metals (except for Ti) and a Ni or Ca compound, and b) a binder;

carrying out firing at 1,700° C. or less in an inert atmosphere to form a conductive metallized layer on said substrate.

Further, in the metallizing composition for use in the nitride type ceramic substrate of the embodiment ii) of this invention, a first invention is characterized by comprising from 26 to 90% by weight of Mo or W, from 5 to 70% by weight of an oxide of a group IVa active metal, and from 2 to 20% by weight of at least one selected from compounds of fourth period transition metals (except for Ti); and a second invention thereof is characterized by comprising from 26 to 90% by weight of Mo or W, from 5 to 70 % by weight of an oxide of a group IVa active metal and from 2 to 20% by weight of at least one selected from compounds of fourth period transition metals (except for Ti), and from 2 to 15% by weight of a Ni or Ca compound.

DESCRIPTION OF THE PREFERRED EMBODIMENTS

Figure 1:
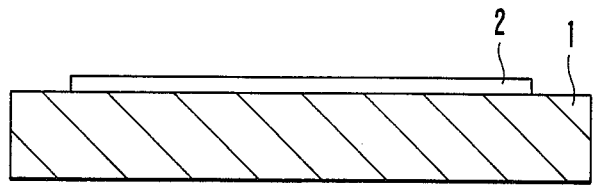
FIG. 1 is a cross-section illustrating a circuit substrate of this invention.

The circuit substrate of this invention will be described below.

In the circuit substrate of this invention, preferred as the nitride type ceramic sintered sheet as exemplified by the AlN sintered sheet is a material having a thermal conductivity of 50 W/m·K or more. Such an AlN sintered sheet is prepared, for example, by mixing AlN powder having a given grain size, a sintering aid such as $Y_2O_3$, $YF_3$, $Sm_2O_3$ and $CaCo_3$ and a binder component of wax type or plastic type in a given weight ratio, forming the resulting mixture into a sheet at room temperature by pressure forming or by a doctor blade to make a formed body, and thereafter sintering the resulting formed body.

At this time, the conditions such as the grain size of the AlN powder or sintering aid powder, mixing ratio of the both, forming pressure, sintering temperature and sintering time in the respective steps may be appropriately selected to determine the properties of the resulting AlN sintered sheet.

Also, the conductive metallized layer formed on the surface of this AlN sintered sheet is a conductive layer containing at least one of W, Mo and TiN.

Specifically, it is a layer constituted of a single component of W, Mo and TiN, respectively; a layer constituted of two components like W and Mo, W and TiN, and Mo and TiN; and further a layer constituted of three components of W, Mo and TiN. When the metallized layer is constituted of multiple components, there is no particular limitation in the incorporating proportion for the respective components.

In the substrate of this invention, what is most characteristic is that a layer of the compounds containing yttrium and alumina is present in the vicinity of the interface between the above nitride type ceramic sintered sheet and the metallized layer and inside the metallized layer. The mechanism by which the formation of this $Al_2O_3$—$Y_2O_3$ compound layer in the vicinity of the interface and inside the metallized layer improves the joint strength is presumed that the $Al_2O_3$—$Y_2O_3$ compound is penetrated into both the substrate AlN and the metallized layer.

The nitride type ceramic substrate of this invention can be prepared in the following manner:

First, prepared according to a conventional method is a nitride type ceramic sintered sheet having given properties, in particular, a thermal conductivity of 50 W/m·k or more. Next, on the surface of this nitride type ceramic sintered sheet, a paste containing the components for forming the intended metallized layer is coated. As the coating method, there may be applied known methods as exemplified by screen process printing, brushing, spin roller coating, etc.

The paste is constituted of the components for forming the metallized layer and a medium for dispersing them. More specifically, it is constituted of powder of any one of W, Mo, Ti and TiN or two or more of them appropriately combined, dispersed in a medium. For example, when the metallized layer comprises a TiN layer, Ti powder or TiN powder may be used as the paste component. The medium to be used may include, for example, ethyl cellulose, nitrocellulose, and a mixture of these with turpineol, tetralin or butyl carbitol serving as a solvent. The dispersion amount of the above components in the medium may be appropriately determined according to the relation with the viscosity of the resulting paste. An excessively large amount of the former may result in a highly viscous paste, making difficult the uniform coating on the nitride type ceramic sintered sheet. In an instance adverse thereto, the paste may have so lower viscosity that the coated paste may flow down from the surface of the nitride type ceramic sintered sheet. In usual instances, the former may be dispersed in the latter so as to give $1.0 \times 10^5$ to $2.5 \times 10^5$ poise. After coating of the paste, the whole is heated to form the metallized layer. In this heating treatment, required are an inert atmosphere of such as nitrogen gas and a temperature of from 1,600° to 1,900° C.

The temperature lower than 1,600° C. may result in insufficient formation of the metallized layer of good quality and at the same time so poor diffusion and penetration in the vicinity of the interface, of the compounds containing yttrium and alumina that the joint strength can be improved with insufficiency. The temperature higher than 1,900° C. may bring about inconveniences as there may be caused lowering of wettability of Mo, W or the like in the metallized layer with the substrate. It may preferably range from 1,700° to 1,800° C.

In this heating process, crystals of the compounds containing yttrium and alumina that were present between crystal grains of nitride type ceramics and distributed in the nitride type ceramic sintered sheet are presumed to turn to a state of a liquid phase, and move to the interface with the metallized layer, and further penetrate also into the metallized layer side across the interface.

In the description hitherto made, described was the instance in which the nitride type ceramic sintered sheet is used when the aluminum nitride compound substrate of this invention is prepared, but the preparation of the nitride type ceramic substrate may not be limited to the above method. For example, the above paste may be coated on the surface of the formed body, and then a heating treatment may be applied to it as a whole. In this instance, it follows that the formation of the paste into the metallized layer proceeds simultaneously with the sintering of the formed body.

The circuit substrate according to the embodiment i) of this invention will be described below with reference to FIG. 1. In FIG. 1, the numeral 1 denotes an aluminum nitride substrate comprising a sintered body of aluminum nitride AlN. This aluminum nitride substrate 1 is prepared by forming and sintering with use of powder obtained by adding, for example, $Y_2O_3$ to aluminum nitride as a sintering aid for the purpose of enhancing the sinter density. The proportion of $Y_2O_3$ added to the aluminum nitride substrate ranges from 0.1 to 10% in weight ratio. The numeral 2 denotes a metallized layer formed on and joined to the surface of the aluminum nitride substrate 1. This metallized layer 2 is formed by coating on the surface of the aluminum nitride substrate 1 a paste chiefly comprised of molybdenum or tungsten and a compound of titanium, zirconium or hafnium, specifically an oxide, nitride or chloride of titanium, zirconium or hafnium added thereto as an activation metal, followed by firing. In this metallized layer 2, molybdenum and tungsten are thermoresistant metals that may not be oxidized at the time of firing, and the activation metal is a metal that turns active at high temperatures at the time of the firing and reacts with aluminum nitride of the aluminum nitride substrate 1 to join the metallized layer 2 to the aluminum nitride substrate 1. In this metallized layer 2, also present in a uniformly dispersed state over the whole of the metallized layer 2 are compounds of $Al_2O_3$ with $Y_2O_3$, namely compounds having the same components as the grain boudary substances in the aluminum nitride substrate 1. This compounds have the action of being fused at the time of the firing of the metallized layer 2 to join the metallized layer 2 to the aluminum nitride substrate 1. The proportion of the compounds of $Al_2O_3$ with $Y_2O_3$ present in the metallized layer 2 should range from 3 to 25% in weight ratio. This is because an excessively large amount of the compounds present in the metallized layer 2 may result in that the metallized layer 2 is covered with the compounds of $Al_2O_3$ with $Y_2O_3$, or an overly small amount of the compounds may result in a small joint strength between the metallized layer 2 and the aluminum nitride substrate 1.

The surface of the metallized layer 2 is also plated with Ni, and a semiconductor device is further mounted by use of a Ag solder.

Since in the circuit substrate constituted like this the compounds of $Al_2O_3$ with $Y_2O_3$, the same components as in the grain boundary substances in the aluminum nitride substrate 1, are contained in the metallized layer 2, the compounds act on the aluminum nitride substrate 1 as an adhesive having a strong affinity for the aluminum nitride substrate 1, so that the metallized layer 2 can be joined to the aluminum nitride substrate 2. More specifically, the metallized layer 2 has a good affinity for the aluminum nitride substrate 1, and joins to the aluminum nitride substrate 1 with a great joint strength. Especially when the metallized layer 2 is formed, the compounds of $Al_2O_3$ with $Y_2O_3$ can be readily controlled to be uniformly distributed and the compounds are uniformly dispersed over the whole area of the metallized layer 2. Thus, the metallized layer 2 joins to the aluminum nitride substrate 1 over its whole area with a uniform joint strength. Also, the grain boundary substances present in the aluminum nitride substrate 1 are fused at the firing of the metallized layer 2 to exude to the surface and penetrate into the metallized layer 2. However, since the compounds of $Al_2O_3$ with $Y_2O_3$ have been already present in the metallized layer 2 to prescribe the joint strength of the aluminum nitride substrate 1, there occurs no non-uniformity of the joint strength because of the penetration of the grain boundary substances.

A method for preparing the circuit substrate according to the embodiment i) will be described below.

This preparation method can be grouped into two ways according to the manner by which the compounds are incorporated into the metallized layer. One of them is a method in which, taking the example of aluminum nitride as an example of the nitride type ceramics, the compounds are coated on the surface of the aluminum nitride substrate, and the metallizing paste is coated thereon, followed by firing in an integral fashion. In this method, first, the compounds of $Al_2O_3$ with $Y_2O_3$ are powdered, and the resulting powder is formed into a paste. Next, the resulting paste or solution is coated on the surface of the aluminum nitride substrate with a uniform thickness. Thereafter, the paste chiefly comprised of Mo or W and the activation metal added thereto is coated on the surface of the layer of the above compounds. As an example for the coating thickness of the respective layers, assuming that the aluminum nitride substrate has a thickness of 0.6 mm, the compounds are with a thickness of 2 $\mu$m and the metallizing paste is with a thickness of 10 $\mu$m, so that the total thickness for the compounds and metallizing paste is 12 $\mu$m. The compound layer and the metallized layer are then fired in an integral fashion. At the time of this firing, the compound layer is fused to soak into the metallized layer and simultaneously adhere to the aluminum nitride substrate, so that the metallized layer is firmly and uniformly joined to the aluminum nitride substrate.

Another method is a method in which a metallizing paste obtained by adding the compounds of $Al_2O_3$ with $Y_2O_3$ or each of $Al_2O_3$ and $Y_2O_3$ independently is coated on the surface of the aluminum nitride substrate, followed by firing. In the instance where $Al_2O_3$ and $Y_2O_3$ are independently added, these are added in the proportion, for example, of 5% in weight ratio in total based on the metallizing paste, and the mutual proportion of $Al_2O_3$ $Y_2O_3$ is controlled, for example, to 5:3. In the instance where the compounds of $Al_2O_3$ with $Y_2O_3$ are added, they are added in the proportion of 5% in weight ratio based on the metallizing paste. The metallizing paste to which $Al_2O_3$ and $Y_2O_3$ are added like this in the state of compounds or in an independent state is thoroughly kneaded. The resulting metallizing paste is coated on the surface of the aluminum nitride substrate to carry out firing. In this occasion, it is coated with a thickness of 10 $\mu$m relative to 0.6 mm of the aluminum nitride substrate. Temperature patterns at the firing are the same as in the case of the method described previously. The $Al_2O_3$ and $Y_2O_3$ added independently are reacted by this firing to produce a compound. The metallized layer thus formed is firmly and uniformly joined to the aluminum nitride substrate.

A method of measuring and controlling the joint strength between the aluminum nitride substrate and metallized layer to secure the quality of circuit substrates will be described below.

This method has been accomplished by taking note of the fact that the X-ray diffraction intensity of the compounds of $Al_2O_3$ with $Y_2O_3$ and the joint strength between the aluminum nitride substrate and metallized layer are in a proportional relationship.

Figure 2:
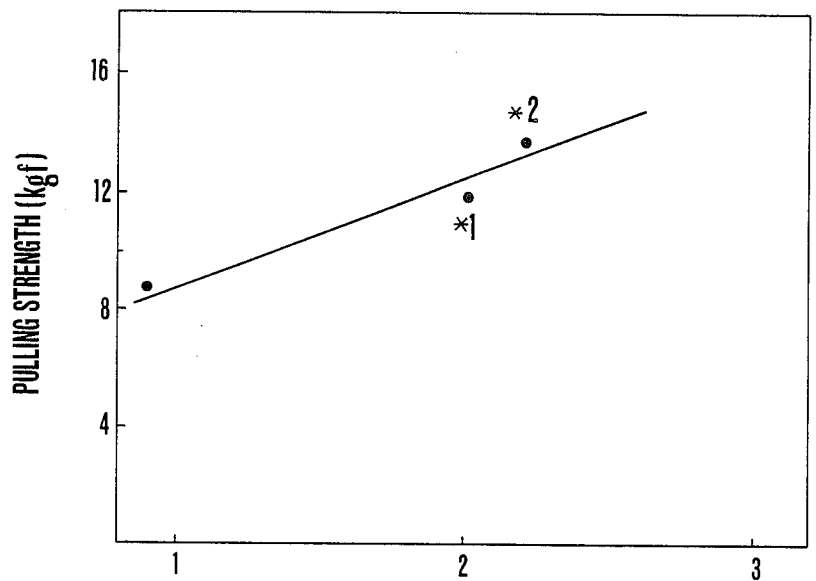
FIG. 2 is a chart for explaining a method of measuring the joint strength of a metallized layer to a substrate.

The aluminum nitride substrate is coated with the metallizing paste according to the method previously described, followed by firing at a firing temperature, for example, of 1,800° C., 1,750° C. or 1,700° C. to prepare three kinds of substrates on which the metallized layer chiefly comprised of Mo or W and containing the compounds of $Al_2O_3$ with $Y_2O_3$ Using an X-ray diffraction apparatus, X-ray diffraction intensities of the aluminum nitride substrate and the metallized layer are measured for each substrate. Next, tests for measuring the joint strength of the metallized layer to the aluminum nitride substrate, i.e., the pulling strength were carried out for each substrate. The test was made in such a manner that a pad of a square shape having 2 mm sides is provided on the aluminum nitride substrate and an annealed copper wire having a diameter of 0.8 mm was joined thereto by using a Pb-Sn plating, followed by pulling to a vertical direction. As a result, it was found that the relationship as shown in the chart of FIG. 2 is established between the pulling strength of the metallized layer and the Mo-W compound intensity ratio. Here, the Mo-W compound represents a compound containing molybdenum or tungsten singly or molybdenum and tungsten in combination. In the figure, peeling ocurred between Ni coatings and metallized faces at the black points denoted by *1 and *2. Accordingly, the X-ray diffraction intensity may be measured for the metallized layer of the circuit substrate and the results thus obtained may be applied to the graph of FIG. 2 to make examination, whereby the joint strength (pulling strength) of the metallized layer to the aluminum nitride substrate can be known. Also, it is found that those having high X-ray diffraction intensity becomes low in Ni-plating property when the intensity is over a certain limit. For example, when it is intended to ensure 8 kgf/mm$_2$ or more of joint strength of the metallized layer, there may be selected a circuit substrate having 1.0 or more of Mo-W compound intensity ratio.

According to this method, the joint strength of the metallized layers of circuit substrates can be readily and precisely measured without relying on destructive tests.

The nitride type ceramic substrate used in the embodiment ii) may include those comprising ceramic sintered bodies chiefly comprised of AlN, $Si_3N_4$ or SiAlON, etc.

In the present embodiment, the metallizing composition used for forming the conductive layer on the nitride type ceramic substrate is chiefly comprised of Mo and/or W, an oxide of a IVa group active metal and a compound of a fourth period transition metal (except for Ti), and optionally blended with a Ni or Ca compound as a fourth component. The respective components in this metallizing composition may preferably be blended so as to be in the blending proportion of from 26 to 90% by weight for the high-melting metal, from 2 to 70% by weight for the group IVa active metal, and from 2 to 20% by weight for the compound of a fourth period transition metal (except for Ti).

In this metallizing composition, Mo and W are high-melting metals that may not be oxidized even at high temperatures and serve as a main conductive material in the conductive metallized layer. In particular, W has a thermal expansion coefficient more approximate to that of the nitride type ceramic substrate than Mo, also having good electrical conductivity and thermal conductivity, and therefore may preferably be used. The blending proportion of less than 26% by weight for this high-melting metal may result in an increase in the electrical resistance of the conductive metallized layer, and that more than 90% by weight may result in a lowering of the joining force to the ceramic substrate.

The oxide of a group IVa active metal is a compound that can be activated at baking temperatures, reacts with the nitride type ceramic substrate serving as a mother material to turn into a nitride, contributes to the joining of the conductive metallized layer, and also serves as the constituent components of the intermediate reactive layer. The oxide of the group IVa active metal may include oxides of Ti, Zr or Hf, and particularly preferred is to use oxides of Ti such as TiO, $TiO_2$, etc.

The blending proportion less than 5% by weight for this oxide of a group IVa active metal may result in a lowering of the joint strength or no sufficient lowered-temperature effect of the firing temperature, and that more than 70% by weight may not only bring about any more effect than that but also may result in a lower blending proportion of the high-melting metal to increase the electrical resistance of the conductive metallized layer. Moreover, a sintering property of this substance is not enhanced, the strength inside of the metallized layer is whereby decreased.

The compound of a fourth period transition metal except for Ti is a compound that reacts with the oxide of a group IVa active metal to form a composite compound, which composite compound forms a liquid phase at a relatively low temperature of from about 1,300° C. to about 1,450° C., thus contributing to the lowered temperatures of the firing temperature. The compound of a fourth period transition metal except for Ti may include oxides or chlorides of Co, Ni, Fe, Mn, Cr, V or Sc, and particularly preferred is to use oxides of Co such as $CO_2O_3$. The blending proportion less than 2% by weight for this compound of a fourth period transition metal except for Ti may result in no sufficient lowered-temperature effect of the firing temperature, and that more than 20% by weight may result in a lower blending proportion of the high-melting metal like the oxide of a group IVa active metal, thus making it difficult to attain a sufficient conductivity of the metallized layer.

In the metallizing composition of this invention, it is possible to blend, in addition to the above respective components, a Ni compound or a Ca compound such as CaO and $CaCO_3$, for the purpose of improving the sinterability of the high-melting metal and improving the wettability with carbonates. When Ni is employed, it is preferable to use metallic powder thereof. This fourth component also has the effect of preventing agglomeration of the metallizing composition at the time of the firing, whereby there can also obtain the advantage that the strict controlling of the firing atmosphere may become less necessary. This Ni or Ca compound may preferably be blended in an amount of from 2 to 15 % by weight. The amount less than 2% by weight may make it difficult to sufficiently obtain the above effect, and that more than 15% by weight may bring about no more effect than that.

To describe below the method for preparing the surface conductive ceramic substrate of this invention, the metallizing composition comprising the above components is first mixed optionally together with a dispersing medium to prepare a metallizing paste with a desired viscosity. This metallizing paste is then coated on the surface of the nitride type ceramic substrate to give a form of desired pattern by, for example, screen process printing, and, after dried, heated to a temperature of 1,700° C. or less, preferably 1,600° C. or less, more preferably from 1,450 to 1,550° C., in an inert atmosphere such as nitrogen gas to effect the firing, thus forming a conductive metallized layer. In regard to the firing temperature in this invention, it becomes possible to form the metallized layer of strong joining force even by use of the relatively low temperature of 1,600° C. or less, by virtue of the action attributable to the oxide of a group IVa active metal and the oxide of a fourth period transition metal except for Ti contained in the metallizing composition. More specifically, considering an instance in which an AlN substrate employing $Y_2O_3$ as a sintering aid is used as the ceramic substrate, an oxide of Ti as the oxide of a group IVa active metal, and an oxide of Co as the compound of a fourth period transition metal, the oxide of Ti reacts with the oxide of Co at the stage of firing the metallizing paste, to produce a composite compound as exemplified by xCoO·yTiO (for example, 2CoO·TiO, CoO·TiO, etc.) or the like. Such a composite compound has so a low-melting point that it forms a liquid phase in the course of the firing to promote the diffusion of the metallized layer side to the grain boundary phase components of AlN, whereby the intermediate reactive layer is formed. This intermediate reactive layer is a layer formed by solidification of the liquid phase that is formed by a compound of Ti such as TiN formed by the reaction of a part of the oxide of Ti with nitrogen of AlN at the time of firing and a compound such as YAG, YAM or YAL produced by the reaction of $Y_2O_3$ which is the grain boundary constituent phase component with $Al_2O_3$ formed simultaneously with the formation of TiN. Thus, because of the formation of the liquid phase between the metallized layer and the ceramic substrate at the time of firing, an excellent joining force can be attained even at the relatively low temperature of 1,700° C. or less. At the same time, the respective components forming this intermediate reactive layer little penetrate into the metallized layer under the firing temperature of this invention, and form the intermediate reactive layer at the interface between the metallized layer and ceramic substrate, so that there is also no possibility of the electric resistance being lowered. Also, as previously mentioned, the liquid phase formed by the composite compound of the oxide of Ti and oxide of Co promotes the diffusion of the grain boundary phase components of AlN to the metallized layer side, so that the firm joining is made possible even on a ceramic substrate containing less grain boundary phases, in other words, a ceramic substrate having a high purity and high thermal conductivity.

Moreover, the oxide of Ti, which reacts with AlN to form a nitride of Ti, also contributes to the joining of the metallized layer and to the suppression of a shrinkage of Mo.

The surface conductive ceramic substrate is obtained in this manner, thereby obtaining the surface conductive ceramic substrate in which, although there are contained the nitride of a group IVa active metal and the composite compound of the oxide of a group IVa active metal and the compound of a fourth period transition metal, the conductive metallized layer rich in W or Mo content is firmaly joined to the nitride type ceramic substrate through the intermediate reactive layer.

In the embodiment ii), since the oxide of a IVa active metal and the compound of a fourth period transition metal except for Ti are blended in the metallizing composition, these produce the low-melting composite compound, and this forms the liquid phase, making it possible to form the metallized layer on the ceramic substrate at lower temperatures, and also making it possible to far more increase the blending amount for W or Mo as compared with conventional cases. The liquid phase formed by this composite compound also promotes the diffusion of the metallized layer side to the grain boundary phase components of the nitride type ceramic substrate, so that the intermediate reactive layer playing a role as an adhesive for the ceramic substrate and metallized layer can be sufficiently formed even on the ceramic substrate containing less grain boundary phases, in other words, the ceramic substrate having a high purity and high thermal conductivity, thus providing the surface conductive ceramic substrate having a superior joint strength between the ceramic substrate and metallized layer. Further, the grain boundary phase components diffused into the metallized layer side from the nitride type ceramic substrate become substantially components constituting the intermediate reactive layer and hardly exude to the surface of the matallized layer to make the formation of the plating layer easy.

EXAMPLE 1

Mixed were 50 parts by weight of Mo powder of a grain size of from 1 to 2 $\mu$m and 50 parts by weight of TiN powder of a grain size of from 1 to 2 $\mu$m, and 100 parts by weight of the resulting mixed powder were dispersed in 7 parts by weight of ethyl cellulose to prepare a paste having a viscosity of $1.5 \times 10^5$ poise.

This paste was coated with a thickness of 15 $\mu$m by roller coating on one side of an AlN substrate containing 5% by weight of $Y_2O_3$ as a sintering aid. This substrate was sintered for about 1 hour at a temperature of 1,700° C. in a dry nitrogen gas stream.

On the resulting AlN sintered sheet, a metallized layer was formed. The X-ray diffraction confirmed that the metallized layer had a constituent phase comprising Mo and TiN.

Figure 3:
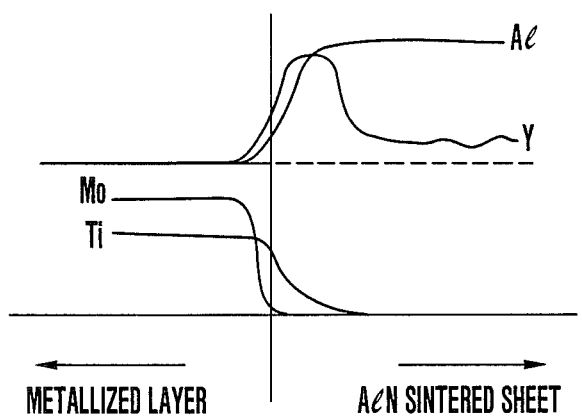
FIG. 3 is a view showing a result of EPMA line analysis in the vicinity of the interface between a metallized layer and an AlN sintered sheet in the AlN substrate according to this invention.

Subsequently, EPMA line analysis in the vicinity of the interface of the metallized layer and AlN sintered sheet of the AlN substrate obtained was carried out to obtain the results as shown in FIG. 3.

As will be clear from FIG. 3, Y was seen to be present in a concentratedly one-sided manner on the AlN sintered sheet side, suggesting the presence of a YAG layer.

Figure 5:
FIG. 5 is a photography of a scanning electron microscopy representing the metal structure near the interface.

A scanning electron microscope photography around this interface is also shown as FIG. 5. As will be clear from FIG. 5, YAG crystals (white area in the figure) are concentrated to the interface area without uniform dispersion into the AlN sintered sheet (right side area in the figure).

Next, on the metallized layer of this AlN substrate, a Ni coating of about from 3 to 5 $\mu$m in thickness was formed by electroless plating. Subsequently, the coating was sintered in a homing gas of 800° C., and thereafter a Kovar wire of 0.5 mm in wire diameter, having a pulling strength of 55 kg/mm², was brazed on it with use of silver solder. The brazing was carried out at a temperature of 800° C. in an atmosphere of a hydrogen 50 vol. % - nitrogen 50 vol. % mixed gas atmosphere.

Thereafter, the AlN substrate was fixed and the Kovar wire was pulled under room temperature (20° C.) to observe the peeling state of the metallized layer.

The brazed portion of the Kovar wire to the metallized layer was pulled off when the pulling force reached 5 kgf/mm². In other words, the joint strength between the AlN substrate and metallized layer was found to be more than 5 kgf/mm².

For comparison, an AlN substrate was prepared in the same manner as in Example except for using a sintering temperature of 1,600° C.

Figure 4:
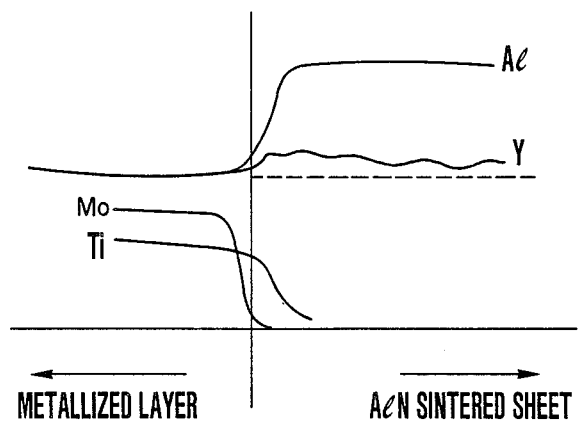
FIG. 4 is a view showing a result of EPMA line analysis in the vicinity of the interface between a metallized layer and an AlN sintered sheet in the AlN substrate of a comparative example.
Figure 6:
FIG. 6 is a photography of a scanning electron microscopy representing the metal structure near the interface.

Results of EPMA line analysis in the vicinity of the interface with this AlN substrate are shown in FIG. 4 and a scanning electron microscopy photography thereof in FIG. 6.

As will be clear from FIG. 4, Y is not concentrated in the vicinity of the interface. This is also clear from FIG. 6 in which YAG crystals (white area in the figure) are uniformly scattered in the inside of the AlN sintered sheet.

The joint strength between the metallized layer and AlN sintered sheet in this comparative AlN substrate was also measured in the same manner as in Example and found to be 1 kgf/mm² or less.

EXAMPLE 2

A powder comprising aluminum nitride powder and 3% in weight ratio, of $Y_2O_3$ added thereto was formed by a doctor brade process, and the resulting formed body was fired under the conditions of a nitrogen gas atmosphere, a temperature of about 1,800° C. and a time of 2 hours to prepare an aluminum nitride substrate of 0.35 mm in thickness. Also, a powder mixed in the ratio of $Al_2O_3$. $Y_2O_3=1:1$ was added to a paste of Mo : TiN = 1:1 in the proportion of 5% in weight ratio, followed by kneading. This paste was coated on the aluminum nitride substrate to have a thickness of 10 μm, and fired for 5 hours at 1,700° C. in a nitrogen gas atmosphere to form a metallized layer. The X-ray diffraction intensity of the metallized layer of this circuit substrate was measured. As a result, the Mo-W compound intensity ratio was found to be 1.0. This diffraction intensity ratio was applied to the chart of FIG. 2 to examine the joint strength of the metallized layer to find that it was about 8.4 kgf/mm². The metallized layer was also found to be uniformly joined to the aluminum nitride substrate.

EXAMPLE 3

Prepared was an aluminum nitride substrate same as in Example 1. A paste comprising compounds of $Al_2O_3$:$Y_2O_3$=5:3 was also prepared, and this paste was coated with a thickness of 2 μm by a printing process on the surface of the aluminum nitride substrate prepared under the same conditions as in Example 2. Subsequently, on the resulting paste layer, a paste comprising Mo:TiN=1:1 was coated with a thickness of 10 μm, followed by firing to form a metallized layer. The joint strength of this metallized layer was measured to find that it was 2.8 kgf/mm².

COMPARATIVE EXAMPLE 1

On the surface of the aluminum nitride substrate prepared under the same conditions as in Example 2, a paste comprising Mo:TiN =1:1 was coated with a thickness of 10 μm, followed by firing to form a metallized layer. The joint strength of this metallized layer was measured to find that it was 2.0 kgf/mm² in average, but the joint strength of the metallized layer was scattered as +1.5 kgf/mm².

EXAMPLE 4

First, $Co_2O_3$ powder was added to a mixed powder of Mo and $TiO_2$ to form a paste. In this instance, the mixing ratio in the mixed powder of Mo and $TiO_2$ and the ratio of $Co_2O_3$ powder to this mixed powder were varied as shown below to prepare three kinds of pastes having different compositional ratios. The compositional ratios are as follows: $(Mo:TiO_2):Co_2O_3=(75:25):5$, (90:10):5, and (95:5):5. Then, the prepared pastes were coated with a thickness of about 10 μm each on the aluminum nitride substrates. Subsequently, the pastes coated on the aluminum nitride substrates were fired. Here, the firing was carried out at firing temperatures varied to 1,700° C., 1,650° C., 1,600° C., 1,550° C. and 1,500° C., respectively. The firing atmosphere was $N_2$ gas.

In the circuit substrates thus prepared, tests were carried out to measure the joint strength of metallized layers formed on the aluminum nitride substrates. The test method is a method in which a Ni coating is formed by plating with a thickness of from 5 to 7 μm on the surface of the metallized layer, a pin made of a solder plated soft copper wire of 60 mm in length and 0.8 mm in diameter was soldered on this Ni coating, and a pulling force measured when a pulling force is applied to this pin until the pin is taken off is regarded as the joint strength. As a result, the joint strength of the metallized layer of each circuit substrate was found to be 3.8 to 4.8 kgf/mm² in regard to the samples fired at temperatures of 1,550° C. and 1,500° C. Also, there was seen no scattering in the joint strength of the metallized layer for each circuit substrate.

EXAMPLE 5

First, $Co_2O_3$ powder was added to a mixed powder of Mo and $TiO_2$ to form a paste. In this instance, the mixing ratio in the mixed powder of Mo and $TiO_2$ and the ratio of $Co_2O_3$ powder to this mixed powder were varied as shown below to prepare three kinds of pastes having different compositional ratios.

The compositional ratios are as follows:
$(Mo:TiO_2):Co_2O_3 = (75:25):5$, (90:10):5, and (95:5):5. Also prepared were aluminum nitride substrates with use of a powder comprising aluminum nitride powder and 3% in weight ratio, of $Y_2O_3$ added thereto. Then, the prepared pastes were coated with a thickness of about 10 μm each on the aluminum nitride substrates. Subsequently, the pastes coated on the aluminum nitride substrates were fired. Here, the firing was carried out at firing temperatures varied to 1,700° C., 1,650° C., 1,600° C., 1,550° C. and 1,500° C., respectively. The firing atmosphere was $N_2$ gas.

In the circuit substrates thus prepared, tests were carried out to measure the joint strength of metallized layers formed on the aluminum nitride substrates. The test method is a method in which a Ni coating is formed by plating with a thickness of from 5 to 7 μm on the surface of the metallized layer, a pin made of a solder plated soft copper wire of 60 mm in length and 0.8 mm in diameter was soldered on this Ni coating, and a pulling force measured when a pulling force is applied to this pin until the pin is taken off is regarded as the joint strength. As a result, the joint strength of the metallized layer of each circuit substrate was found to be 4 to 5 kgf/mm² in regard to the samples fired at temperatures of 1,550° C. and 1,500° C. Also, there was seen no scattering in the joint strength of the metallized layer for each circuit substrate. AlN substrates showing particularly high joint strength were subjected to EPMA line analysis in the vicinity of the interface of the metallized layer and AlN sintered sheet of the AlN substrates. As a result, there were observed presence of a compound of yttrium and aluminum.

COMPARATIVE EXAMPLE 2

On the surface of an aluminum nitride substrate prepared under the same conditions as in Example 5, a paste comprising $Mo:TiO_2=1:1$ was coated with a thickness of 10 μm, followed by firing to form a metallized layer. The joint strength of the metallized layer was measured to find that the strength was low at every portion in the range of from 0.5 to 1.5 kgf/mm².

EXAMPLE 6

First, using a mixed powder comprising AlN powder and 3% by weight of $Y_2O_3$ added thereto as a sintering aid, prepared were AlN ceramic substrate A having a thickness of 0.4 mm and a thermal conductivity of 200 W/m·k and AlN ceramic substrate B having a thickness of 0.5 mm and a thermal conductivity of 260 W/m·k.

On the other hand, using Mo powder, $TiO_2$ powder and $Co_2O_3$ powder, these were mixed so as to comprise 81.8% by weight of Mo, 9.1% by weight of $TiO_2$ and 9.1% by weight of $Co_2O_3$ to prepare a metallizing composition having an average grain size of 0.8 μm. Thereafter, an organic binder and a dispersing medium were added to this metallizing composition, followed by thorough mixing to prepare metallizing paste a. Next, this metallizing paste a was coated on the above ceramic substrates A and B, respectively, by #325 mesh screen process coating in a prescribed pattern form so as to have a thickness of 20 μm after dried, and, after dried, heated and fired for 180 minutes at 1,500° C. in respect of ceramic substrate A and 1550° C. in respect of ceramic substrate B in a nitrogen gas atmosphere, thus preparing ceramic substrates having conductive metallized layers.

In respect of the ceramic substrates thus obtained, analyses by EDX (energy disperse type X-ray microanalyzer) and SEM (scanning electron microscope) was carried out to find that there were observed at a depth of 10 to 12 μm from the surface a metallized layer chiefly comprised of Mo and containing a trace amount of TiN and compounds of TiO with CoO, and, at the interface between this metallized layer and ceramic substrate, an intermediate reactive layer containing compounds of Al with Y and TiN.

The joint strength of the metallized layers thus obtained was also found to be as high as 4 to 5 kgf/mm$_2$ and 2.5 to 3 kgf/mm$^2$ each, when a soft copper wire of 1.0 mm in diameter was joined to a pad of 4 mm$^2$ by soldering with a tin-lead alloy and pulled. The resistivity of of these metallized layers was also found to be as good as 102 mΩ/□ and 105 mΩ/□ each.

On the other hand, for comparison with this invention, the ceramic substrates A and B used in Examples 5 were coated with a metallizing paste obtained by mixing Mo powder and TiN powder in the compositional ratio of 1:2 (weight ratio) and adding a binder (Comparative Example 3) and a metallizing paste obtained by mixing Mo powder and $TiO_2$ powder in the compositional ratio of 68:32 (weight ratio) and adding a binder (Comparative Example 4 ), respectively, and these were fired at temperatures raised up to 1,700° C. However, the joint strength of any metallized layers were found to be as small as 0.8 kgf/mm$^2$. The electrical resistivity was also found to be about 200 Ω·cm.

EXAMPLES 7 to 26

Prepared were metallizing compositions with the blending proportions as shown in Table 1, followed by the same procedures as in Example 6 to prepare metallizing pastes. Next, using these metallizing pastes, they were coated in the same manner as in Example 6 on the ceramic substrates A and B used in Example 6, followed by heating at firing temperatures as shown in Table 2 to form metallized layers.

The joint strength of the resulting metallized layers was shown to be of great value in every case as shown in Table 2. There was also seen excellent electrical resistance.

In regard to the ceramic substrates having the metallized layers according to Examples 19 to 22, 1,000 heat cycle tests were also carried out taking temperatures of from −55° C. to room temperature to 150° C. as one cycle, and thereafter the joint strength was similarly measured to find that there was seen little lowering of the joint strength as shown in Table 2.

TABLE 1

| | Metallizing composition; blending ratio (wt. %) | | | | | | | |
|---|---|---|---|---|---|---|---|---|
| | Mo | W | TiO | $TiO_2$ | $Co_2O_3$ | Ni | $CaF_2$ | $CaCO_3$ |
| a | 81.8 | — | — | 9.1 | 9.1 | — | — | — |
| b | 68.2 | — | — | 22.7 | 9.1 | — | — | — |
| c | 87.4 | — | — | 9.7 | 2.9 | — | — | — |
| d | 87.8 | — | — | 9.3 | 2.9 | — | — | — |
| e | 72.8 | — | — | 24.3 | 2.9 | — | — | — |
| f | 80.0 | — | 9.0 | — | 4.0 | 7.0 | — | — |
| g | 80.0 | — | — | 9.0 | 4.0 | 7.0 | — | — |
| h | — | 80.0 | 9.0 | — | 4.0 | 7.0 | — | — |
| i | — | 80.0 | — | 9.0 | 4.0 | 7.0 | — | — |
| j | 80.0 | — | 10.0 | — | 5.0 | — | — | 5.0 |
| k | 80.0 | — | — | 10.0 | 5.0 | — | — | 5.0 |
| l | — | 80.0 | 10.0 | — | 5.0 | — | — | 5.0 |
| m | — | 80.0 | — | 10.0 | 5.0 | — | — | 5.0 |
| n | 90.0 | — | — | 6.0 | 2.0 | — | — | 2.0 |
| o | 90.0 | — | 6.0 | — | 2.0 | — | — | 2.0 |
| p | 90.0 | — | — | 6.0 | 2.0 | — | 2.0 | — |
| q | 90.0 | — | 6.0 | — | 2.0 | — | 2.0 | — |
| r | 90.0 | — | — | 6.0 | 2.0 | — | — | 2.0 |
| s | 90.0 | — | 6.0 | — | 2.0 | — | — | 2.0 |
| t | 90.0 | — | — | 6.0 | 2.0 | — | 2.0 | — |
| u | 90.0 | — | 6.0 | — | 2.0 | — | 2.0 | — |
| v | 80.0 | — | — | 10.0 | 5.0 | — | — | 5.0 |
| w | 80.0 | — | 10.0 | — | 5.0 | — | — | 5.0 |
| x | 80.0 | — | — | 9.0 | 4.0 | 7.0 | — | — |

TABLE 2

| | Type of substrate | Metallizing composition | Firing temp. (°C.) | Joint strength (kgf/mm$^2$) | Joint strength after heat cycle test (kgf/mm$^2$) | Electrical resistance (Ω/□) |
|---|---|---|---|---|---|---|
| 7 | A | b | 1562 | 4.0 | 3.7 | 450 |
| 8 | A | c | 1550 | 2.5 | 2.4 | 210 |
| 9 | A | e | 1500 | 2.4 | 2.3 | 215 |
| 10 | A | f | 1450 | 3.6 | 3.4 | 49 |
| 11 | B | f | 1500 | 2.6 | 2.2 | 45 |
| 12 | A | g | 1500 | 3.7 | 3.3 | 42 |
| 13 | B | g | 1550 | 3.0 | 2.8 | 41 |
| 14 | A | h | 1450 | 3.6 | 3.3 | 50 |
| 15 | B | h | 1500 | 2.5 | 2.3 | 40 |
| 16 | A | i | 1500 | 3.9 | 3.8 | 45 |
| 17 | B | i | 1550 | 3.1 | 2.9 | 42 |
| 18 | A | j | 1450 | 3.3 | 3.2 | 50 |
| 19 | A | k | 1500 | 4.0 | 4.0 | 42 |
| 20 | A | l | 1450 | 3.4 | 3.4 | 53 |
| 21 | A | m | 1500 | 4.0 | 4.0 | 43 |
| 22 | A | n | 1500 | 3.3 | 3.4 | 34 |
| 23 | A | o | 1500 | 3.0 | 2.7 | 33 |
| 24 | A | p | 1500 | 3.9 | 3.9 | 35 |

TABLE 2-continued

| | Type of substrate | Metallizing composition | Firing temp. (°C.) | Joint strength (kgf/mm²) | Joint strength after heat cycle test (kgf/mm²) | Electrical resistance (Ω/□) |
|---|---|---|---|---|---|---|
| 25 | A | q | 1500 | 3.9 | 3.9 | 32 |
| 26 | A | q | 1600 | 4.8 | 4.5 | 37 |

EXAMPLE 27

Metallizing pastes having the following compositions were prepared.

| | Mo | $TiO_2$ | $Mn_3O_4$ | Ni |
|---|---|---|---|---|
| MTM - 1 | 80 | 13 | 7 | — |
| MTM - 2 | 80 | 17 | 3 | — |
| MNTH - 1 | 80 | 7 | 7 | 6 |

Figure 7:
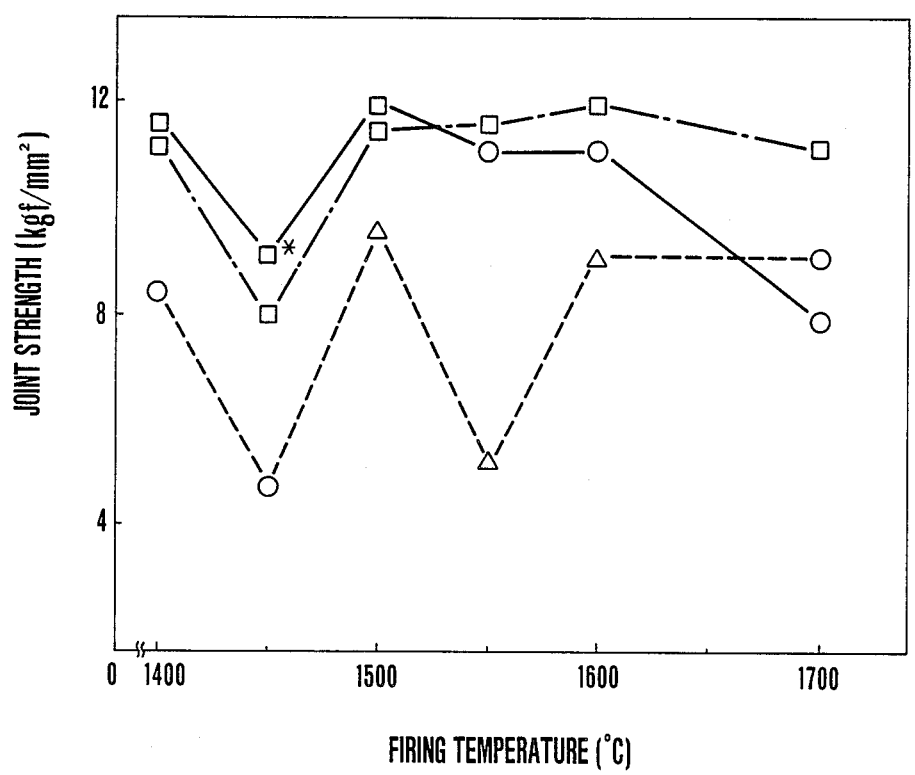
FIG. 7 is a graph showing a measurement result of a joining force of a metallized layer to a substrate.

These pastes were coated on the circuit substrates respectively, followed by firing at temperarures of 1,400, 1,450, 1,500, 1,550 and 1,600, respectively. In regard to the circuit substrates having metallized layer were subjected to the joint strength test. The results are shown in a graph of FIG. 7. In the figure, a solid line denotes the metallized layer of the composition of MTM-1, an alternate long and short dash line MTM-2, a broken line MNTM - 1. Also, in this figure, * represents that deconstruction of a substrate occured.

Also, deconstruction mode represented by o, □ and Δ show the condition of the deconstruction as a result of the joint strength test as follows.

o . . . deconstruction in an interface between the metallized layer and the ceramic.

□ . . . deconstruction in the ceramic.

Δ . . . peeling occurs between the metallized layer and the Ni plating.

As will be clear from the above description, the nitride type ceramic substrate of this invention has the $Al_2O_3$-$Y_2O_3$ compound layer concentratedly formed in the vicinity of the interface between the metallized layer and the nitride type ceramic sintered sheet and inside of the metallized layer, thus achieving a high joint strength between the metallized layer and nitride type ceramic sintered sheet. Accordingly, the nitride type ceramic substrate of this invention has high reliability when put into practical use, bringing about great industrial value.

According to the embodiment i) of this invention, there can be also obtained the highly reliable circuit substrate in which the metallized layer comprising Mo or W has been firmly joined to the substrate with uniform joint strength.

According to the embodiment ii) of this invention, the joint strength of the conductive metallized layer can be great and also free of scattering, and moreover it is possible to increase the high-melting metal to about 90% by weight of the metallized layer. Thus, the electrical properties are greatly improved, and further the difference in thermal expansion coefficient between the ceramic substrate and metallized layer is made small to lower the residual stress, so that there can be provide surface conductive ceramic substrates improved in the reliability.

It also becomes possible to form the metallized layer with use of sintering temperatures far lower than the conventional cases, and therefore there can be also obtained the advantages that the warpage of the substrate can be prevented, the production cost can be reduced, and the production processes can be made continuous.

It further becomes possible to form the conductive metallized layer with a sufficient strength even in the high purity ceramic substrate containing less grain boundary phase components, in other words, the ceramic substrate having a high thermal conductivity, so that it becomes possible to mount chips of large output on a module of small size.

We claim:

1. An aluminum nitride ceramic substrate comprising: an aluminum nitride ceramic sintered sheet; a conductive metallized layer comprising at least one of the group consisting of molybdenum and tungsten formed on said aluminum nitride ceramic sintered sheet; and a layer of a compound containing yttria and alumina at the interface between said aluminum nitride ceramic sintered sheet and said metallized layer and penetrating the metallized layer.

2. An aluminum nitride ceramic substrsate according to claim 1 wherein said compound containing yttria and alumina is uniformly distributed at the interface.

3. An aluminum nitride substrate according to claim 1 wherein said compound of yttria and alumina further penetrates said aluminum nitride sheet at the interface with said metallized layer.

* * * * *